United States Patent
Arena et al.

(10) Patent No.: US 7,396,415 B2
(45) Date of Patent: Jul. 8, 2008

(54) APPARATUS AND METHODS FOR ISOLATING CHEMICAL VAPOR REACTIONS AT A SUBSTRATE SURFACE

(75) Inventors: Chantal J. Arena, Mesa, AZ (US);
Chris Werkhoven, Tempe, AZ (US);
Ron Bertram, Gilbert, AZ (US)

(73) Assignee: ASM America, Inc., Phoenix, AZ (US)

( * ) Notice: Subject to any disclaimer, the term of this patent is extended or adjusted under 35 U.S.C. 154(b) by 295 days.

(21) Appl. No.: 11/144,510

(22) Filed: Jun. 2, 2005

(65) Prior Publication Data

US 2006/0275546 A1 Dec. 7, 2006

(51) Int. Cl.
*H01L 21/00* (2006.01)
*C23C 16/00* (2006.01)
*C23C 14/00* (2006.01)

(52) U.S. Cl. .................. 118/715; 118/728; 156/345.33; 156/345.34; 156/345.51

(58) Field of Classification Search ........... 118/715–33, 118/728; 156/345.1–55, 345.33, 345.34, 156/345.51

See application file for complete search history.

(56) References Cited

U.S. PATENT DOCUMENTS 5,851,589 A * 12/1998 Nakayama et al. ....... 427/248.1
6,013,155 A * 1/2000 McMillin et al. ....... 156/345.33
2003/0075273 A1 4/2003 Kilpela et al.
2004/0142558 A1 7/2004 Granneman
2004/0216665 A1 11/2004 Soininen et al.
2004/0216668 A1 11/2004 Lindfors et al.

* cited by examiner

Primary Examiner—Ram N. Kackar
(74) Attorney, Agent, or Firm—Knobbe, Martens, Olson & Bear LLP

(57) ABSTRACT

An apparatus and method for processing a substrate is provided. The apparatus comprises a reaction chamber, a substrate holder within the chamber, and first and second injector components. The reaction chamber has an upstream end and a downstream end, between which the substrate holder is positioned. The substrate holder is configured to support a substrate so that the substrate is within a plane extending generally toward the upstream and downstream ends. The first injector component is at the upstream end of the chamber and is configured to inject a first thin gas curtain toward a substrate supported by the substrate holder. The first injector component is configured to inject the first curtain generally along a first plane that is parallel to a first side of the substrate. The second injector component is configured to inject a second thin gas curtain toward the first side of the substrate. The second injector component is configured to inject the second gas curtain generally along a second plane oriented at an angle with respect to the first plane. The angled flows of source gases have reduced interdiffusion volume above the substrate, preferably resulting in deposition substantially along a line extending across the center of the substrate. The substrate can be rotated during deposition to produce a substantially uniform film on the substrate.

17 Claims, 2 Drawing Sheets

APPARATUS AND METHODS FOR ISOLATING CHEMICAL VAPOR REACTIONS AT A SUBSTRATE SURFACE

INCORPORATION BY REFERENCE

This application incorporates by reference the full disclosures of U.S. Pat. Nos. 4,828,224 and 6,093,252, and U.S. patent application Ser. No. 10/696,481, filed Oct. 29, 2003, entitled STAGGERED RIBS ON PROCESS CHAMBER TO REDUCE THERMAL EFFECTS.

BACKGROUND OF THE INVENTION

1. Field of the Invention

The present invention relates generally to semiconductor processing equipment and specifically to systems and methods for improving deposition thickness uniformity and quality.

2. Description of the Related Art

High-temperature ovens, called reactors, are used to create structures of very fine dimensions, such as integrated circuits on semiconductor substrates. One or more substrates, such as silicon wafers, are placed on a substrate support inside the reaction chamber. Both the substrate and support are heated to a desired temperature. In a typical substrate treatment step, reactant gases are passed over the heated substrate, causing the chemical vapor deposition (CVD) of a thin layer on the substrate. Various process conditions, particularly temperature uniformity and reactant gas distribution, must be carefully controlled to ensure a high quality of the resulting layers.

Through a series of deposition, doping, photolithography, and etch steps, the starting substrate and subsequent layers are converted into integrated circuits, with a single substrate producing from tens to thousands or even millions of integrated devices, depending on the size of the substrate and the complexity of the circuits.

Batch processors have traditionally been employed in the semiconductor industry to allow simultaneous processing of multiple substrates, thus economically providing low processing times and costs per substrate. Advances in miniaturization and attendant circuit density, however, have lowered tolerances for imperfections in semiconductor processing. Accordingly, single-substrate processing reactors are now in use, providing improved control of deposition conditions.

In a typical CVD process, one or more reactant gases are passed above the substrate so that they chemically react to deposit a thin layer of material onto the substrate. The reactant materials are ordinarily injected along with a carrier gas, such as hydrogen. The reaction typically produces reaction byproducts that are drawn away by the flow of an inert purge gas, such as hydrogen or nitrogen gas. In epitaxial deposition, the deposited layer maintains the same crystalline structure as the underlying layer or material. Some reactors involve the horizontal flow of reactant gases above the substrate surface. An excellent example of this type of reactor is available commercially under the trade name Epsilon® from ASM America, Inc. of Phoenix, Ariz. Other reactors have so-called showerhead injectors above the substrate, which inject reactant gases downward toward the substrate surface.

One problem with CVD processing is the tendency of some sets of reactants to react in the gas phase before they reach the substrate. This leads to particulate formation, or "gas phase nucleation," which in turn increases growth rate non-uniformities across the substrate. Not all reactions involve gas phase nucleation. For example, gas phase nucleation is not ordinarily a problem in the epitaxial deposition of silicon (Si), germanium (Ge), and silicon germanium (SiGe). An example of a process in which gas phase nucleation can be a significant problem is the growth of gallium nitride (GaN) for light-emitting diode (LED) applications. Gallium nitride can be grown from the reaction of gallium source gas trimethylgallium ("TMG") and nitrogen source gas ammonia ($NH_3$) at a temperature of about 1100° C. and a pressure of several hundred Torr.

A prevalent solution to overcome the problem of gas phase nucleation is the use of a showerhead injector (or simply showerhead) that includes separate outlets or holes for the individual reactant gases. This type of injector generally prevents premature mixing until the gases reach the substrate surface, thus reducing gas phase nucleation. However, this approach is very limited because showerhead injectors are process-specific and less useful for conducting a series of different processes and reactions. The optimal size and distribution of the outlets in the showerhead depends upon the nature of the reactant gases used. Also, the effectiveness of this type of injector depends on the process conditions (e.g., process temperature, flow rates of the reactants, etc.). Deviations from the optimal size and distribution of the injector outlets and optimal process conditions can result in loss of uniformity control of the processed wafer.

Another problem with using a showerhead is that it is often incompatible with high temperature CVD processes (e.g., above 800-900° C.). At elevated temperatures (e.g., above 600° C.), the substrate and substrate holder radiate a significant amount of heat toward the showerhead. The resultant temperature increase of the showerhead can cause reactant gases to decompose prematurely in the injector holes. This leads to clogging of the injector holes and loss of control over the growth rate of the deposited layers on the substrate. Water-cooling of the showerhead can alleviate this problem to some extent, but it further complicates the showerhead construction and typically does not sufficiently suppress this problem.

SUMMARY OF THE INVENTION

Accordingly, it is a principle object and advantage of the present invention to overcome some or all of these limitations and to provide an improved apparatus and method for growing films on substrates.

In one aspect, the present invention provides an apparatus for processing a substrate, comprising a reaction chamber, a substrate holder within the chamber, and first and second injector components. The reaction chamber has an upstream end and a downstream end, between which the substrate holder is positioned. The substrate holder is configured to support a substrate so that the substrate is within a plane extending generally toward the upstream and downstream ends. The first injector component is at the upstream end of the chamber and is configured to inject a first thin gas curtain toward a substrate supported by the substrate holder. The first injector component is configured to inject the first curtain generally along a first plane that is parallel to a first side of the substrate. The second injector component is configured to inject a second thin gas curtain toward the first side of the substrate. The second injector component is configured to inject the second gas curtain generally along a second plane oriented at an angle with respect to the first plane.

In another aspect, the present invention provides a method of processing a substrate. In accordance with the method, a substrate is provided. A first reactant gas is injected toward the substrate as a gas curtain flowing generally along a first plane that is parallel to a first side of the substrate. A second reactant gas is injected toward the first side of the substrate as a gas curtain flowing generally along a second plane that is oriented at an angle with respect to the first plane. The first and second reactant gases are configured to chemically react with one another to deposit a layer of material onto the first side of the substrate.

In another aspect, the present invention provides a method of processing a substrate. In accordance with the method, a substrate is provided within a single-substrate processing chamber. A first reactant gas is injected into the chamber in a first direction extending toward the substrate, the first direction being generally parallel to a first side of the substrate. A second reactant gas is injected into the chamber in a second direction extending toward the first side of the substrate, the second direction being oriented at an angle with respect to the first direction. The first and second gases are simultaneously present within the chamber and are configured to chemically react with one another to deposit a layer of material onto the first side of the substrate.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

DETAILED DESCRIPTION OF THE PREFERRED EMBODIMENT

While the preferred embodiments are presented in the context of a single-substrate, cold-wall reactor, it will be understood that certain aspects of the invention will have application to reactors of other types. The illustrated design facilitates sequential processing while minimizing reactant interaction with each other and with chamber surfaces. Reactions to be avoided include highly exothermic or explosive reactions, such as produced by oxygen and hydrogen-bearing reactants, and reactions that produce particulate contamination of the chamber. The skilled artisan will recognize, however, that for certain sequential processes, other reactor designs can also be provided for achieving these ends, provided sufficient purge time is allowed to remove the incompatible reactants.

Figure 1:
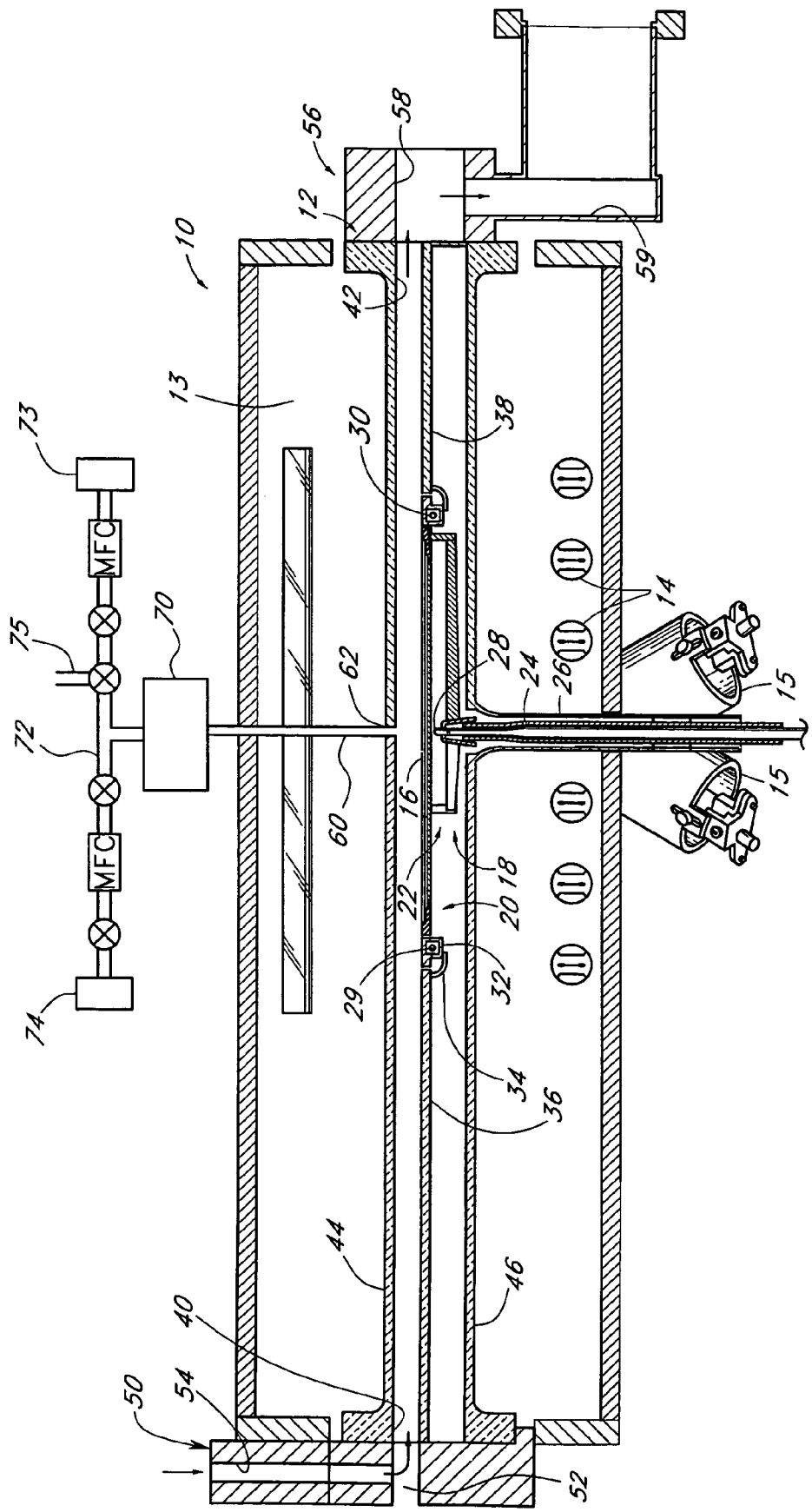
FIG. 1 is a schematic sectional view of an exemplary single-substrate reaction chamber for use with preferred embodiments of the invention.

FIG. 1 shows a CVD reactor 10, including a quartz process or reaction chamber 12, constructed in accordance with a preferred embodiment, and for which the methods disclosed herein have particular utility. While the basic configuration of the reactor 10 was originally designed to optimize epitaxial deposition of silicon on a single substrate at a time, it has been found that the superior processing control has utility in CVD of a number of different materials. Moreover, the illustrated reactor 10 can safely and cleanly accomplish CVD of silicon oxide and silicon nitride.

The reaction chamber 12 includes a ceiling 44 and a floor 46. Between the ceiling 44 and floor 46 are a substrate holder 20, a slip ring 32, a front chamber divider 36, and a rear chamber divider 38, which divide the chamber 12 into upper and lower sections. The ceiling 44, floor 46, dividers 36 and 38, and chamber side walls are formed of quartz, which does not appreciably absorb heat energy. As such, the reactor 10 is referred to as a "cold wall" reactor. A plurality of radiant heat sources are supported outside the chamber 12 to provide heat energy in the chamber without appreciable absorption by the quartz chamber walls. While the preferred embodiments are described in the context of a cold wall CVD reactor for processing semiconductor wafers, it will be understood that the processing methods described herein will have utility in conjunction with other heating/cooling systems, such as those employing inductive or resistive heating.

The illustrated radiant heat sources comprise an upper heating assembly of elongated tube-type radiant heating elements 13. The upper heating elements are preferably disposed in spaced-apart parallel relationship and also substantially parallel with the process gas flow path from a first injector component 50 (described below) through the underlying reaction chamber. A lower heating assembly comprises similar elongated tube-type radiant heating elements 14 below the reaction chamber 12, preferably oriented transverse to the upper heating elements 13. Desirably, a portion of the radiant heat is diffusely reflected into the chamber 12 by rough specular reflector plates (not shown) above and below the upper and lower lamps 13, 14, respectively. Additionally, a plurality of spot lamps 15 supply concentrated heat to the underside of the substrate support structure (described below), to counteract a heat sink effect created by cold support structures extending through the bottom of the reaction chamber 12.

Each of the elongated tube-type heating elements 13, 14 is preferably a high intensity tungsten filament lamp having a transparent quartz envelope containing a halogen gas, such as iodine. Such lamps produce full-spectrum radiant heat energy transmitted through the walls of the reaction chamber 12 without appreciable absorption. As is known in the art of semiconductor processing equipment, the power of the various lamps 13, 14, 15 can be controlled independently or in grouped zones in response to temperature sensors.

A substrate 16, preferably comprising a silicon wafer, is shown supported within the reaction chamber 12 upon a substrate support structure 18. Note that, while the substrate 16 of the illustrated embodiment is a single-crystal silicon wafer, it will be understood that the term "substrate" broadly refers to any surface or generally planar element onto which a layer is to be deposited, including, without limitation, a glass substrate.

The illustrated support structure 18 includes the substrate holder 20, upon which the substrate 16 rests, and a support spider 22. The spider 22 is mounted to a shaft 24, which extends downwardly through a tube 26 depending from the chamber lower wall. Preferably, the tube 26 communicates with a source of purge or sweep gas which can flow during processing, inhibiting process gases from escaping to the lower section of the chamber 12 (i.e., the section between the floor 46 and the dividers 36, 38). Preferably, the shaft 24 is configured to be rotated about a central vertical axis so that the spider 22, holder 20, and substrate 16 can be rotated during processing, which advantageously improves processing uniformity across the substrate surface. A suitable motor can be provided for rotating these elements.

A plurality of temperature sensors is positioned in proximity to the substrate 16. The temperature sensors may take any of a variety of forms, such as optical pyrometers or thermocouples. The number and positions of the temperature sensors are selected to promote temperature uniformity within the substrate holder 20 and substrate 16. Preferably, however, the temperature sensors directly or indirectly sense the temperature of positions in proximity to the substrate.

In the illustrated embodiment, the temperature sensors comprise thermocouples, including a first or central thermocouple 28, suspended below the substrate holder 20 in any suitable fashion. The illustrated central thermocouple 28 passes through the spider 22 in proximity to the substrate holder 20. The reactor 10 further includes a plurality of secondary or peripheral thermocouples, also in proximity to the substrate 16, including a leading edge or front thermocouple 29, a trailing edge or rear thermocouple 30, and a side thermocouple (not shown). Each of the peripheral thermocouples are housed within the slip ring 32, which surrounds the substrate holder 20 and the substrate 16. Each of the central and peripheral thermocouples are connected to a temperature controller, which sets the power of the various heating elements 13, 14, 15 in response to the readings of the thermocouples.

In addition to housing the peripheral thermocouples, the slip ring 32 absorbs and emits radiant heat energy during high temperature processing, such that it compensates for a tendency toward greater heat loss or absorption at substrate edges, a phenomenon that is known to occur due to a greater ratio of surface area to volume in regions near such edges. By minimizing edge losses, slip ring 32 can reduce the risk of radial temperature non-uniformities across the substrate 16. The slip ring 32 can be suspended by any suitable means. For example, the illustrated slip ring 32 rests upon elbows 34 that depend from the front chamber divider 36 and the rear chamber divider 38. The dividers 36, 38 desirably comprise quartz plates. In some arrangements, the rear divider 38 can be omitted.

The illustrated reaction chamber 12 includes a first inlet port 40 at an upstream end of the chamber for the injection of process gases (reactants for CVD, carrier gases, etchants, dopants, etc.). The port 40 also provides access for receiving the substrate 16 therethrough. A first gas injector component 50 is fitted to the reaction chamber 12, adapted to surround the first inlet port 40, and includes a horizontally elongated slot 52 (i.e., elongated in the direction extending perpendicular to the plane of FIG. 1) through which the substrate 16 can be inserted. A generally vertical inlet 54 of the gas injector component 50 receives process gases from remote sources and communicates such gases with the slot 52 and the first inlet port 40.

The first gas injector component 50 is preferably configured to inject process gases through one or more openings horizontally into the chamber 12, generally along a plane that is above and parallel to the top side of the substrate 16. Preferably, the first gas injector component 50 is configured to inject the gas as a thin laminar gas curtain. In the illustrated reactor 10, the dimension (e.g., height) of the reaction chamber 12 that limits the thickness of the first gas curtain 102 (FIG. 2) injected from the first gas injector component 50 is very small, thus promoting a laminar flow. This dimension is preferably less than 15 cm, more preferably less than 5 cm, and even more preferably less than 2 cm. The reaction chamber 12 also includes a second gas injector component 60 above the substrate holder 20 and substrate 16. Like the first gas injector component 50, the second gas injector component 60 receives process gases from remote sources and injects such gases into the chamber 12 through one or more openings. In one embodiment, a transverse slit is formed in the ceiling 44 of the reaction chamber 12 and an injector is secured (e.g., welded) to the slit, the injector having a plurality of internal gas-injection openings. The second injector component 60 is preferably configured to inject the gas as a thin gas curtain toward the top side of the substrate 16, as described in greater detail below.

Those of ordinary skill in the art will understand that there are a variety of different gas injector configurations for the first and second gas injector components 50, 60, which can be employed to meet the objectives of the present invention. In some embodiments, one or both of the injector components 50, 60 comprises a gas-injection slit. In other embodiments, one or both of the injector components 50, 60 comprises a plurality of gas-injection openings (e.g., circular holes, slits, etc.), which are preferably aligned. It will be appreciated that the appropriate size of the openings will often depend upon the materials that are injected into the chamber, and perhaps also on the flow rates of the injected gases. A preferred gas injector configuration for either of the injector components 50, 60 is described with respect to FIGS. 21-26 and related text of U.S. Pat. No. 6,093,252.

In the illustrated embodiment, the reactor 10 also includes a source 70 of excited species. The excited species source 70 of the illustrated embodiment comprises a remote plasma generator, including a magnetron power generator and an applicator along a gas line 72. An exemplary remote plasma generator is available commercially under the trade name TR-850 from Rapid Reactive Radicals Technology (R3T) GmbH of Munich, Germany. In the illustrated embodiment, microwave energy from a magnetron is coupled to a flowing gas in an applicator along the gas line 72. A source of precursor gases 73 is coupled to the gas line 72 for introduction into the excited species generator 70. A source of carrier gas 74 is also coupled to the gas line 72. One or more further branch lines 75 can also be provided for additional reactants. As is known in the art, the gas sources 73, 74 can comprise gas tanks, bubblers, etc., depending upon the form and volatility of the reactant species. Each gas line can be provided with a separate mass flow controller (MFC) and valves (illustrated as encircled X's), to allow selection of relative amounts of carrier and reactant species introduced to the generator 70 and thence into the reaction chamber 12 via the second injector component 60. It will be appreciated that the first injector component 50 is preferably likewise connected to an assembly of precursor gas sources, carrier gas, mass flow controllers, valves, and/or a source of excited species, as is known in the art. It will be appreciated that the second gas injector component 60 need not be coupled to a source 70 of excited species, as shown.

An outlet port 42 is on an opposite, downstream end of the chamber 12, with the substrate support structure 18 positioned between the inlet 40 and the outlet 42. An outlet component 56 mounts to the process chamber 12 such that an exhaust opening 58 aligns with the outlet port 42 and leads to exhaust conduits 59. The conduits 59, in turn, can communicate with suitable vacuum means (not shown) for drawing process gases through the chamber 12. In the preferred embodiment, process gases are drawn through the reaction chamber 12 and a downstream scrubber (not shown). A pump or fan is preferably included to aid in drawing process gases through the chamber 12, and to evacuate the chamber for low pressure processing.

Substrates 16, such as silicon semiconductor wafers, are preferably passed from a handling chamber (not shown), which is isolated from the surrounding environment, through the slot 52 by a pick-up device. The handling chamber and the processing chamber 12 are preferably separated by a gate valve (not shown) of the type disclosed in U.S. Pat. No. 4,828,224.

The total volume capacity of a single-substrate process chamber 12 designed for processing 200 mm substrates, for example, is preferably less than about 30 liters, more preferably less than about 20 liters, and most preferably less than about 10 liters. The illustrated chamber 12 has a capacity of about 7.5 liters. Because the illustrated chamber 12 is divided by the dividers 32, 38, substrate holder 20, ring 32, and the purge gas flowing from the tube 26, however, the effective volume through which process gases flow is around half the total volume (about 3.77 liters in the illustrated embodiment). Of course, it will be understood that the volume of the single-substrate processing chamber 12 can be different, depending upon the size of the substrates for which the chamber 12 is designed to accommodate. For example, a single-substrate processing chamber 12 of the illustrated type, but for 300 mm substrates, preferably has a capacity of less than about 100 liters, more preferably less than about 60 liters, and most preferably less than about 30 liters. One 300 mm substrate processing chamber has a total volume of about 24 liters, with an effective processing gas capacity of about 11.83 liters.

With reference to the illustrated reactor 10, many CVD processes can be conducted by using only the first gas injector component 50, and not the second gas injector component 60. Typically, the first injector component 50 injects a preferably laminar flow of mixed source gases into the reaction chamber 12 generally along a plane that is parallel to the top surface of the substrate 16. The heat lamps 13, 14, and 15 impart radiant heat to the substrate holder 20 and substrate 16, which are rotated about a central vertical axis to promote uniform deposition across the substrate surface. Reaction byproducts and unreacted gases are exhausted through the exhaust opening 58. This technique provides a precise yet flexible way of implementing complex temperature recipes. The combination of cross flow injection, substrate rotation, and radiant lamp heating provides excellent control, particularly over processes that do not suffer from gas phase nucleation.

For some reactions, such as the epitaxial growth of GaN from TMG and ammonia source gases, it can be difficult to prevent gas phase nucleation in the reaction chamber 12 if all of the source gases are injected from the first injector component 50. This is because the distance between the first injector component 50 and the substrate 16 is relatively large. It is generally desirable that this distance be large in order to avoid heating of the flange of the first injector component 50. In a typical reactor, this flange is secured against a flange of another component with a rubber O-ring or like seal interposed therebetween. The heating of the flanges can degrade the rubber seal and thereby lead to loss of reactor integrity, which can produce contamination of the reaction chamber 12. This in turn results in loss of process control and deposited layer quality. Heating of the upstream injector flange can also lead to clogging of the injection-orifices of the first injector component 50, as described above in the Background section.

Figure 2:
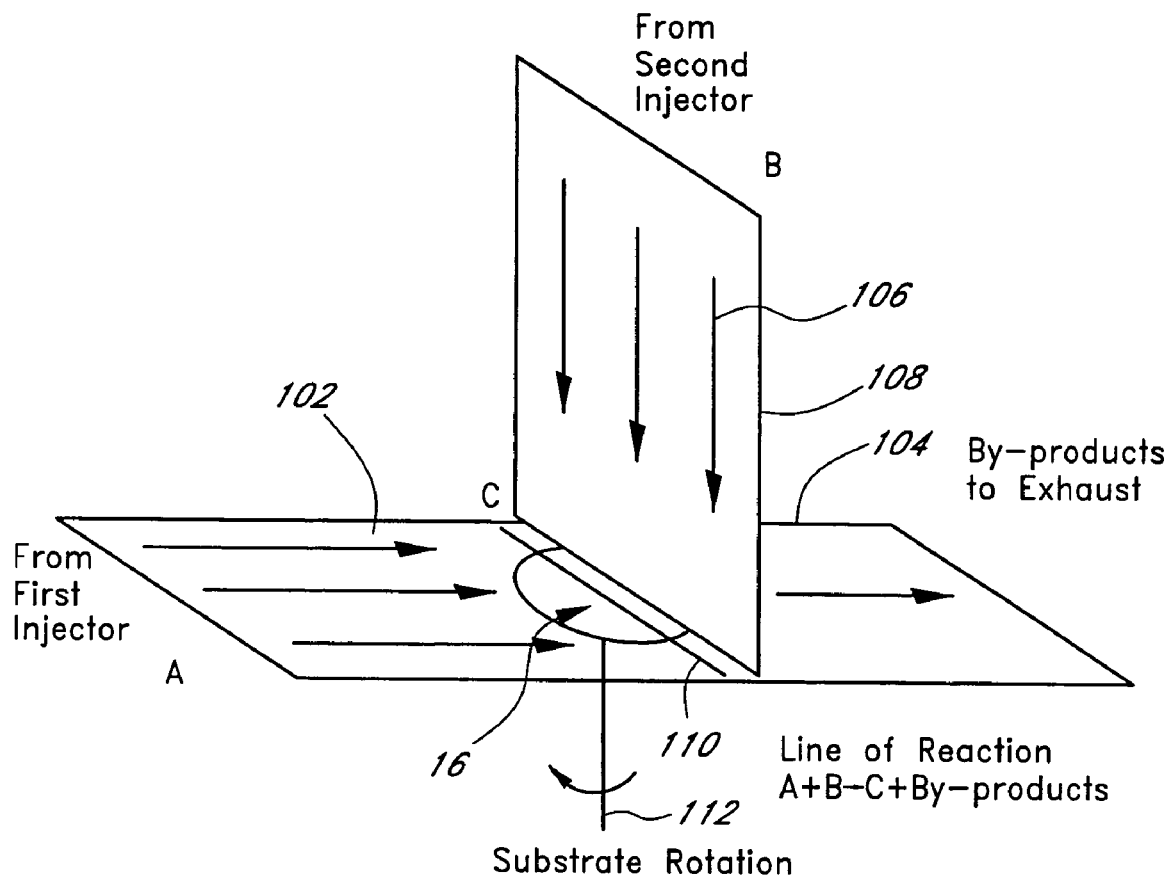
FIG. 2 is a schematic illustration of chemical reaction involving two separated reactant gas flows, according to a preferred embodiment of the invention.

Accordingly, the invention involves the separation of the source gases associated with a CVD process. FIG. 2 schematically shows two reactant gas flows for a CVD reaction in the chamber 12, according to a preferred embodiment. The illustrated CVD process comprises a reaction of a first reactant gas A and a second reactant gas B to produce a deposited layer of material C on a semiconductor substrate 16 supported by a substrate holder 20 (FIG. 1). The reaction also produces byproducts that are exhausted from the reaction chamber 12. The precursors A and B are typically mixed with an inert carrier gas, such as $H_2$ or $N_2$.

In the illustrated embodiment, the first reactant gas A is injected from the first gas injector component 50 (FIG. 1) toward the substrate 16. Preferably, the first reactant gas A is injected as a gas curtain 102 flowing generally along a first plane 104 that is parallel to and spaced closely above the top side of the substrate 16. The second reactant gas B is injected from the second gas injector component 60 toward the top side of the substrate 16. Preferably, the second reactant gas B is injected as a gas curtain 106 flowing generally along a second plane 108 that is oriented at an angle with respect to the first plane 104. In this configuration, the first reactant gas A and the second reactant gas B are configured to chemically react with one another to deposit a layer of material C onto the top side of the substrate 16. In the illustrated embodiment, the first and second reactant gas curtains 102, 104 intersect and react with one another near the top surface of the substrate 16, such that they result in the deposition of material C substantially along a "line of reaction" 110 on the substrate surface. Advantageously, the reaction of reactants A and B is substantially limited to the line of reaction 110, thus substantially preventing gas phase nucleation. As explained above, the substrate holder 20 is configured to rotate about a central vertical axis 112 that is substantially perpendicular to the first plane 104. Advantageously, each full revolution of the substrate 16 causes a substantially uniform layer of material C to be deposited onto the substrate surface, resulting in substantial improvement in deposition thickness uniformity. Reaction byproducts are exhausted from the chamber 12 through the exhaust opening 58 (FIG. 1).

Preferably, the first plane 104 and first gas curtain 102 are relatively close to the top surface of the substrate 16, so that as the second gas curtain 106 intersects and mixes with the first gas curtain 102, the bulk of the produced material C deposits onto the substrate along the line of reaction 110. That is, the extent to which material C deposits onto the substrate 16 outside of the line 110 is preferably minimized. The distance between the first plane 104 and the substrate surface is preferably no more than 10 cm, more preferably no more than 5 cm, even more preferably no more than 2 cm, and even more preferably no more than 1 cm. Skilled artisans will appreciate that the appropriate distance between the first plane 104 and the substrate surface will often depend upon the flow rates of the two injected gas curtains 102, 106 and the nature of the gases themselves, giving due consideration to the goal of producing a thin line of deposited material on the substrate (such as the illustrated line of reaction 110).

Typically, the substrate 16 is circular (e.g., a circular semiconductor wafer). However, non-circular substrates can alternatively be used. In one embodiment, the second plane 108 intersects a center of the substrate. In the illustrated embodiment, the substrate 16 is oriented in a substantially horizontal plane, such that the first plane 104 (and gas curtain 102) and second plane 108 (and gas curtain 106) intersect along a line that is vertically aligned with the center of the substrate.

In an alternative embodiment, the second plane 108 intersects the substrate 16 along a line of intersection that is somewhat upstream (in relation to the flow of the first gas curtain 102) of the substrate center, the line of intersection preferably being substantially perpendicular to the direction of flow of the first gas curtain. In other words, the second plane 108 preferably intersects the substrate 16 at a position between the first injector component 50 and the substrate center. This compensates for the fact that the first gas curtain 102 may displace the second gas curtain 106 slightly downstream (in relation to the flow of the first gas curtain 102) when the two gas curtains intersect. If the second plane 108 intersects the substrate center, the first gas curtain 102 could push the second gas curtain 106 downstream so that it is displaced behind the substrate center. Skilled artisans will appreciate that if the reacting mixture of the two gas curtains does not flow toward the center of the substrate 16, then there may be relatively less deposited material C at the substrate center. The second injector component 60 and second plane 108 are preferably positioned by taking into careful consideration the extent to which the first gas curtain 102 is expected to displace the second gas curtain 106 in the downstream direction, so that the displaced second gas curtain 106 flows substantially toward the substrate center. The second plane 108 can be either substantially perpendicular or angled with respect to the first plane 104. In either case, the line of intersection of the second plane 108 and the substrate 16 preferably intersects a radial line of the substrate (which is substantially parallel to the direction of flow of the first gas curtain 102) at a position whose displacement from the substrate center is preferably within a range of half the substrate radius to one-tenth of the substrate radius. In other embodiments, such displacement is no more than half the substrate radius, no more than one quarter of the substrate radius, and no more than one-tenth of the substrate radius.

The second plane 108 is preferably perpendicular with respect to the first plane 104. However, skilled artisans will understand that the second plane 108 can intersect the first plane 104 at other angles, as long as the planes intersect closely above the substrate 16, preferably near the center of the substrate. The angle at which the second plane 108 intersects the first plane 104 is preferably within 30°-90°, more preferably within 45°-90°, more preferably within 60°-90°, and even more preferably within 85°-90° (wherein the term "within" is used inclusively).

Skilled artisans will appreciate that the closer the second injector component 60 is located to the substrate 16, the greater the extent to which the deposited material C can be controlled to within the targeted line 110. This is because as the second injector component 60 is positioned more closely to the substrate 16, the second gas curtain 106 has less opportunity to diffuse or widen out before it reaches the substrate. The distance between the injection point (e.g., an orifice or slit) of the second injector component 60 and the substrate 16 is preferably no more than 10 cm, more preferably no more than 5 cm, and even more preferably no more than 2 cm. It will be understood that the appropriate distance between the second injector component 60 and the substrate surface will often depend upon the flow rates of the two injected gas curtains 102, 106 and the nature of the gases themselves, giving due consideration to the goal of producing a thin line of deposited material on the substrate (such as the line of reaction 110). It will be appreciated that the gas-injection orifice (s) of the second injector component 60 can be in the ceiling 44 of the chamber 12 or below the ceiling (if the injector component 60 extends downward below the ceiling).

With reference to FIG. 1, in a preferred embodiment the second gas injector component 60 is formed of quartz and is fused with the quartz walls (e.g., the ceiling 44) of the reaction chamber 12. This eliminates the need for a rubber O-ring or like seal near the gas-injection orifice of the second injector component 60. As explained above, a nearby rubber seal would be at risk of degradation at high temperatures, which would in turn result in reactor contamination and loss of process integrity. Also, since the second injector component 60 would be formed integrally with the chamber 12, it can be provided with a portion that extends away from the chamber 12 so that the nearest rubber seal is distanced sufficiently from the substrate holder 20.

Another advantage of forming the second injector component 60 of quartz is that its temperature tends not to rise to the levels that it would if it were formed of other materials, particularly during higher temperature processes (e.g., greater than 800° C.). This is because, as known in the art, quartz tends to absorb less radiant heat than other materials. Advantageously, the quartz injector component 60 can be located closer to the substrate 16 without reaching very high temperatures. In some cases, this may even permit use of the second injector component 60 for source gases that decompose at elevated temperatures, because the injector component remains below the decomposition temperatures of the source gases. In other cases, the second injector component 60 can be used for source gases that do not decompose at elevated temperatures, so that its close proximity to the substrate 16 does not cause clogging of the injector opening(s). For example, a CVD process might involve the injection of metal-organic source gases like TMG via the first injector component 50 and reactants like ammonia, oxygen, hydrogen, and nitrogen via the second injector component 60.

In a preferred embodiment, the reaction chamber 12 has a cross section such that the ceiling 44 is substantially parallel to the substrate surface. This configuration improves deposition uniformity for processes involving the laminar horizontal flow of process gases from the first injector component 50. In one embodiment, the exterior surface of the reaction chamber 12 includes a plurality of ribs that resist chamber implosion during very low pressure processes. The ribs preferably encircle the chamber side walls, ceiling 44, and floor 46 in a peripheral direction transverse to the flow of process gases from the first injector component 50. An exemplary quartz reaction chamber with ribs is described in U.S. patent application Ser. No. 10/696,481. Preferably, the second injector component 60 is installed between such ribs.

In another aspect of the invention, one or both of the two gas curtains 102, 106 can comprise highly reactive radicals that have only a line of sight life probability. In a preferred embodiment, the second gas injector component 60 is coupled to a source 70 of excited species, as described above and shown in FIG. 1. In this embodiment, the second gas injector component 60 injects a gas curtain 106 of highly reactive radicals that, once having flown more than a specific distance, tend to collide with one another and recombine into a neutral gas. Preferably, the second injector component 60 is positioned so that the highly reactive radicals have only a line of sight life probability. In other words, the distance between the second injector component 60 and the substrate 16 is limited so that if the radicals flow a distance more than a direct line toward the substrate, they tend to recombine into a neutral gas. This in effect means that the radicals tend to recombine into a neutral gas once they flow away from the second plane 108. The second gas curtain 106 of radicals within the second plane 108 reacts with the first gas curtain 102 to result in the deposition of material onto the substrate substantially along the line of reaction 110. For instance, a second gas curtain 106 of nitrogen radicals is very reactive with a first gas curtain 102 of TMG, whereas the nitrogen molecules resulting from the recombination nitrogen radicals are not reactive with TMG. It will be appreciated that another advantage of forming the reaction chamber 12 of quartz is that quartz is relatively more inert with respect to radicals.

By injecting a second gas curtain 106 of highly reactive radicals, the CVD reaction can be even more effectively confined to the line of reaction 110, and gas phase nucleation can be more effectively avoided. It will also be appreciated that, in some configurations, the first injector component 50 can inject highly reactive radicals instead of the second injector component 60.

While the present invention has been described above in relation to embodiments involving a single substrate reaction chamber, the invention may also be implemented in a batch reactor. In one embodiment, a substrate holder is configured to support a plurality of substrates, preferably within substantially the same plane. The first and second injector components 50, 60 are preferably configured to inject first and second gas curtains 102, 106 substantially along first and second planes 104, 108 that intersect along a line closely above the plane of the substrates. Preferably, the substrate holder is configured to be rotated about an axis that is substantially perpendicular to the first plane 104.

Although the invention has been disclosed in the context of certain embodiments and examples, it will be understood by those skilled in the art that the invention extends beyond the specifically disclosed embodiments to other alternative embodiments and/or uses and obvious modifications and equivalents thereof. Accordingly, the invention is not intended to be limited by the specific disclosures of preferred embodiments herein.

What is claimed is:

1. An apparatus for processing a substrate, comprising:
   a reaction chamber having an upstream end and a downstream end;
   a substrate holder positioned within the chamber between the upstream and downstream ends, the substrate holder configured to support a substrate so that the substrate is within a plane extending generally toward the upstream and downstream ends;
      a first injector component at the upstream end of the chamber, the first injector component configured to inject a first thin gas curtain toward a substrate supported by the substrate holder, the first injector component configured to inject the first curtain generally along a first plane that is parallel to a first side of the substrate; and
      a second injector component configured to inject a second thin gas curtain toward the first side of the substrate, the second injector component configured to inject the second gas curtain generally along a second plane oriented at an angle with respect to the first plane, wherein the first and second injector components are configured so that the first and second gas curtains intersect and mix together generally along and substantially throughout a line,
   wherein the second injector component is configured so that the line intersects a center of a circular substrate supported by the substrate holder.

2. The apparatus of claim 1, wherein the substrate holder is configured to rotate about a central axis that is substantially perpendicular to the first plane.

3. The apparatus of claim 1, wherein the second injector component is configured so that the second plane intersects a circular substrate supported by the substrate holder, at a position between the first injector component and a center of the substrate.

4. The apparatus of claim 3, wherein the second plane intersects the substrate along a line of intersection that is substantially perpendicular to a direction of flow of the first gas curtain.

5. The apparatus of claim 4, wherein the second plane is substantially perpendicular to the first plane.

6. The apparatus of claim 4, wherein the line of intersection intersects a radial line of the substrate, the radial line being substantially parallel to the direction of flow of the first gas curtain, the line of intersection intersecting the radial line at a position whose displacement from the substrate center is within half a radius of the substrate and one-tenth of the radius of the substrate.

7. The apparatus of claim 6, wherein the line of intersection intersects the radial line at a position that is displaced from the substrate center by no more than one quarter of the radius of the substrate.

8. The apparatus of claim 1, wherein at least one of the first and second injector components comprises a gas-injection slit.

9. The apparatus of claim 1, wherein at least one of the first and second injector components comprises a plurality of aligned gas-injection openings.

10. The apparatus of claim 1, wherein the second injector component is configured to inject the second gas curtain at a position within 5 cm from the first side of the substrate.

11. The apparatus of claim 1, further comprising a source of excited species, wherein one or both of the first and second injector components is configured to inject the excited species.

12. The apparatus of claim 11, wherein the second injector component is configured to inject the excited species at a distance from the first side of the substrate such that excited species elements that flow away from the second plane tend to collide and recombine in a neutral gas.

13. The apparatus of claim 11, wherein the excited species comprises radicals.

14. The apparatus of claim 1, wherein the substrate holder is configured to support the substrate in a substantially horizontal plane, and the first and second injector components are configured so that the first and second planes intersect along a line that is substantially vertically aligned with a center of the substrate.

15. The apparatus of claim 1, wherein the second plane is oriented at an angle of within 30°-90° of the first plane.

16. The apparatus of claim 15, wherein the second plane is oriented at an angle of within 85°-90° of the first plane.

17. The apparatus of claim 1, wherein the reaction chamber is defined by quartz walls, the second injector component being formed of quartz and being fused with the quartz walls.

* * * * *